(12) United States Patent
Wald et al.

(10) Patent No.: US 9,983,282 B2
(45) Date of Patent: May 29, 2018

(54) STIMULUS INDUCED ROTARY SATURATION FOR MAGNETIC RESONANCE FUNCTIONAL IMAGING

(75) Inventors: Lawrence L. Wald, Cambridge, MA (US); Thomas Witzel, Cambridge, MA (US); Bruce R. Rosen, Lexington, MA (US)

(73) Assignee: The General Hospital Corporation, Boston, MA (US)

( * ) Notice: Subject to any disclaimer, the term of this patent is extended or adjusted under 35 U.S.C. 154(b) by 1807 days.

(21) Appl. No.: 11/944,062

(22) Filed: Nov. 21, 2007

(65) Prior Publication Data

US 2008/0281183 A1    Nov. 13, 2008

Related U.S. Application Data

(60) Provisional application No. 60/875,661, filed on Dec. 19, 2006, provisional application No. 60/860,656, filed on Nov. 22, 2006.

(51) Int. Cl.
*A61B 5/05* (2006.01)
*G01R 33/48* (2006.01)
*G01R 33/56* (2006.01)

(52) U.S. Cl.
CPC .......... *G01R 33/48* (2013.01); *G01R 33/4806* (2013.01); *G01R 33/5602* (2013.01)

(58) Field of Classification Search
USPC ................................................. 600/410–423
See application file for complete search history.

(56) References Cited

U.S. PATENT DOCUMENTS

| 5,530,348 A | 6/1996 | Heflinger |
| 6,496,005 B2 | 12/2002 | Heid |
| 6,836,114 B2 | 12/2004 | Reddy et al. |
| 2007/0167728 A1* | 7/2007 | Mistretta et al. ............. 600/410 |

OTHER PUBLICATIONS

McFadden, "Synchronous Firing and Its Influence on the Brain's Electromagnetic Field", Journal of Consciousness Studies, 9, No. 4, 2002, pp. 23-50.*
Charagundla, "T1p weighted magnetic resonance imaging: principles and diagnostic application", Supplement to Applied Radiology, Jan. 2004, pp. 32-43.*
Konn et al., "MRI Detection of Weak Magnetic Fields Due to an Extended Current Dipole in a Conducting Sphere: A Model for Direct Detection of Neuronal Currents in the Brain", 2003, Magnetic Resonance in Medicine, 50: pp. 40-49.*

(Continued)

*Primary Examiner* — Christopher Cook
(74) *Attorney, Agent, or Firm* — Quarles & Brady LLP

(57) ABSTRACT

Spin-lock $T_{1\rho}$-weighted images of a subject are acquired and processed to produce an image that is indicative of bioelectromagnetic activity in the subject. A spin-lock RF field $B_{1\rho}$ is produced such that the Larmor frequency in the rotating frame corresponds to the expected frequency of the bioelectromagnetic activity. As a result, the magnetic field fluctuations generated by the bioelectromagnetic currents shorten the $T_{1\rho}$ of the surrounding tissue, creating a contrast mechanism that is seen as a reduced MR signal in the $T_{1\rho}$-weighted image that is produced.

11 Claims, 3 Drawing Sheets

(56) References Cited

OTHER PUBLICATIONS

Pell et al., "Further Steps Toward Direct Magnetic Resonance (MR) Imaging Detection of Neural Action Currents: Optimization of MR Sensitivity to Transient and Weak Currents in a Conductor", published online Apr. 6, 2006, Magnetic Resonance in Medicine, 55: pp. 1038-1046.*
F. Bloch, A. Siegert, Magnetic Resonance for Nonrotating Fields, Physical Review, Mar. 15, 1940, vol. 7.
Natalia Petridou, Dietmar Plenz, Afonso C. Silva, Murray Loew, Jerzy Bodurka, Peter A. Bandettini, PNAS published online Oct. 12, 2006, PNAS, Oct. 24, 2006, vol. 103, No. 43, 16015-16020.
J. Bodurka, A. Jesmanowicz, J.S. Hyde, H. Xu, L. Estkowski, S.-J Li, Current Induced Magnetic Resonance Phase Imaging, Journal of Magnetic Resonance 137, 265-271, (1999).
Alfred G. Redfield, Nuclear Magnetic Resonance Saturation and Rotary Saturation in Solids, Physical Review, vol. 98, No. 6, Jun. 15, 1955.
Arijitt Borthakur, Justin Hulvershorn, Eugene Gualtieri, Andrew J. Wheaton, Sridhar Charagundia, Mark A. Elliott, Ravinder Reddy, A Pulse Sequence for Rapid in Vivo Spin-Locked MRI, Journal of Magnetic Resonance Imaging, 23:591-596 (2006).
P. A. Bandettini, N. Petridou, J. Bodurka, Direct Detection of Neuronal Activity with MRI: Fantasy, Possibility, or Reality, Appl. Magn. Reson. 28, 1-XXX (2005).
Justin Hulvershorn et al, T1p Contrast in Functional Magnetic Resonance Imaging; Magnetic Resonance in Medicine 54:1155-1162 (2005).

* cited by examiner

STIMULUS INDUCED ROTARY SATURATION FOR MAGNETIC RESONANCE FUNCTIONAL IMAGING

CROSS-REFERENCE TO RELATED APPLICATIONS

This application claims the benefit of U.S. Provisional patent application Ser. No. 60/875,661 filed on Dec. 19, 2006 and entitled "Stimulus Induced Rotary Saturation For Magnetic Resonance Functional Neuroimaging" and of U.S. Provisional Patent Application Ser. No. 60/860,656 filed on Nov. 22, 2006 and entitled "Stimulus Induced Rotary Saturation For Magnetic Resonance Functional Neuroimaging."

BACKGROUND OF THE INVENTION

The field of the invention is nuclear magnetic resonance imaging methods and systems. More particularly, the invention relates to functional imaging.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The concept of acquiring NMR imaging data in a short time period has been known since 1977 when the echo-planar pulse sequence was proposed by Peter Mansfield (J. Phys. C. 10: L55-L58, 1977). In contrast to standard pulse sequences, the echo-planar pulse sequence produces a set of NMR signals for each RF excitation pulse. These NMR signals can be separately phase encoded so that an entire scan of 64 views can be acquired in a single pulse sequence of 20 to 100 milliseconds in duration. The advantages of echo-planar imaging (EPI) are well-known, and other echo-planar pulse sequences are disclosed in U.S. Pat. Nos. 4,678,996; 4,733,188; 4,716,369; 4,355,282; 4,588,948 and 4,752,735, which are herein incorporated by reference.

Functional magnetic resonance imaging (fMRI) technology provides an approach to study neuronal activity. In conventional fMRI, mapping the eloquent cortex relies on blood oxygen level dependent (BOLD) contrast. The physiological basis of BOLD signal is the regional vasoactive response induced by neuronal activity, causing increases in regional cerebral blood flow, blood oxygen concentration, and consequently, measured MR signal. As described in U.S. Pat. No. 5,603,322, which is herein incorporated by reference, an MRI system is used to acquire signals from the brain over a period of time. As the brain performs a task, these signals are modulated synchronously with task performance to reveal which regions of the brain are involved in performing the task. Much research has been done to find tasks which can be performed by patients, and which reveal in an fMRI image acquired at the same time, regions in the brain that function in response to the tasks.

Additionally, conventional fMRI has been used extensively to study normal brain function, psychiatric conditions, learning disabilities, neurodegenerative conditions, recovery from stroke, and the relationship of eloquent cortex to brain tumors and arteriovenous malformations (AVMs). The preoperative use of fMRI to identify eloquent cortex near resectable lesions is becoming a common clinical imaging scenario for surgical planning. Given the intricate nature of neurosurgical procedures, surgical planning that accurately takes into account the physical locations of neuronal activity during tasks important to quality of life, such as motor control, speech, vision, and hearing is highly desirable. While conventional fMRI techniques present the clinician with valuable information regarding regions of neuronal activity, fMRI is still limited in its capability to provide highly accurate spatial resolution due to the indirect nature of measuring neural activity through the BOLD effect. Furthermore, the BOLD effect in response to a functional task exhibits a large temporal delay on the order of several seconds and additional spatial misregistration between the physical location of the firing neurons and the observed hemodynamic changes can exist. As a result, a more direct means for detecting neuronal activity is desirable.

Neuronal currents produce transient and oscillatory magnetic fields at frequencies (<100 Hz) that can be directly detected by MEG. The source of these fields are thought to be small current dipoles composed of synchronous intracellular postsynaptic currents of parallel pyramidal cells in the cortical mantle and a diffuse current return path. Previous work attempting to detect these magnetic fields with MR has focused on local phase shifts and dephasing effects in $T_2$ or $T_2^*$ weighted images, as discussed in Bandettini et al., Applied Magnetic Resonance, 29(1):65-88, 2005. One potential problem with this method is the detection of bipolar, or "zero mean" temporal waveforms often seen in MEG. Unless the bipolar current pulse is carefully timed around a refocusing pulse in a spin echo experiment, the phase shift induced by the positive and negative episodes of the neuronal current will cancel each other. Also, the dephasing of the MR signal is expected to be very small due to the small size of the neuronal currents and there is considerable debate as to whether the effect can even be observed. And finally, the BOLD hemodynamic signal itself produces dephasing of the MR signal, as do many other phenomena, rendering it difficult to disentangle the origins of observed dephasing.

Recently ultra-low field MRI has been proposed to allow resonant interaction between the neuronal currents and spin magnetization. Here the $B_0$ field is lowered to produce a Larmor frequency of less than 100 Hz and the transient neuronal magnetic fields act as resonant "excitation" pulses providing the initial tip of the proton magnetization. In this case a bipolar or oscillatory "zero mean" neuronal current is actually beneficial as long as its spectrum contains power at the Larmor frequency, which is less than 100 Hz. The sensitivity of the MR system for detecting neuronal currents at such a low $B_0$ field is very low and as a result more sensitive methods for detecting neuronal currents are desired.

SUMMARY OF THE INVENTION

The present invention is a method and system for producing an MR image in which the small magnetic fields produced by bioelectromagnetic activity are detected using spin-locked transverse magnetization produced as part of an MR imaging pulse sequence. Spin-locking is utilized to sensitize the spins to bioelectromagnetic fields oscillating at a Larmor frequency in the rotating frame. Oscillating bioelectromagnetic currents with spectral power at $\omega=\gamma B_{1\rho}$ are capable of producing rotary saturation of the spin-locked magnetization. Thus the bioelectromagnetic currents produce a resonant saturation effect on the MR signal in the rotating frame during the spin-lock state. The resonant frequency in the rotating frame during spin lock can be set to approximately match the expected bioelectromagnetic current oscillations by adjusting the $B_{1\rho}$ amplitude. An image is reconstructed from the acquired data in which regions of bioelectromagnetic activity appear darker.

An object of the invention is to use the magnetic fields associated with neuronal currents to serve the purpose of the rotary saturation field in a spin-lock prepared image acquisition. Since the rotary saturation effect is frequency dependent, the neuronal currents need to be synchronous and have a frequency component on resonance with the prepared spin-lock magnetization or at a harmonic thereof. The spin-lock frequency is controlled through the amplitude of the $B_{1\rho}$ RF pulse. The neuronal currents may be relatively uncontrolled and we set the spinlock frequency to match them, or we modulate the stimulus to ensure that the neuronal firing occurs at a specific rotary saturation frequency.

Another object of the invention is to provide a functional image of the brain. We use the fluctuating magnetic fields associated with neuronal firings to provide a relaxation mechanism for the magnetic resonance phenomena. Thus the saturation effect is the mechanism by which the magnetic fields from stimulus induced neuronal firing will impact the intensity of the MR images of the human brain. Since the image gets darker when the rotary saturation occurs, the location of the activated neurons will appear darker than on a similar image acquired with no activation. Because MR relaxation is a resonant process (precise frequency), and typical MR resonance frequencies used are quite high (60-300 MHz), we use the rotary saturation effect of the spin-locking experiment rather than conventional $T_1$ observations to render the MR sensitive to lower frequency fields expected from the neurons. Since both the fields produced by the neuronal currents and the saturation effect is nearly instantaneous, the image changes appear considerably faster than those that employ the hemodynamic BOLD response.

GENERAL DESCRIPTION OF THE INVENTION

Figure 1:
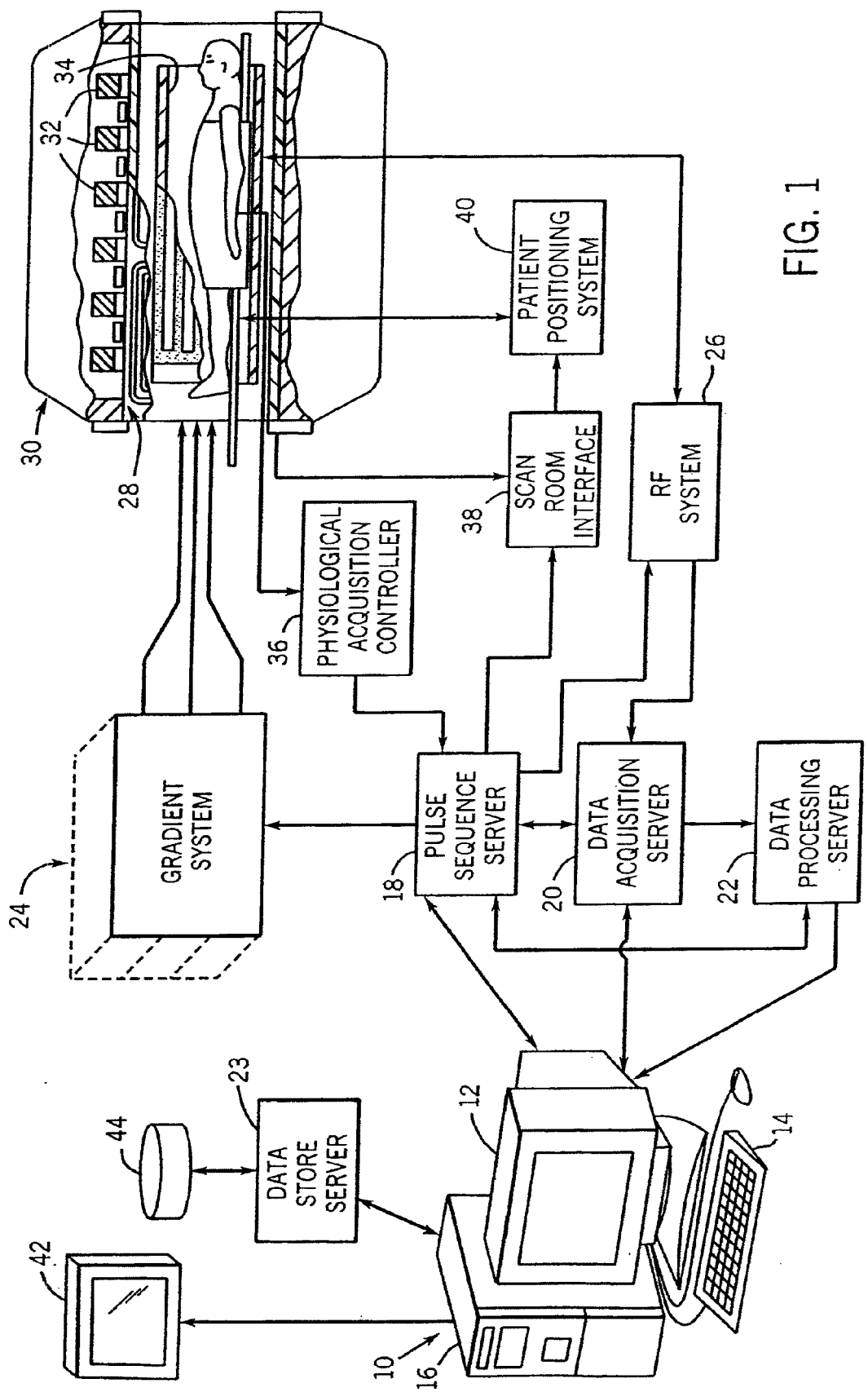
FIG. 1 is a block diagram of an MRI system which employs the present invention.

The MR principle of rotary saturation is a phenomena described in 1955 in solids and liquids (Redfield, Phys Rev 98, p 1787-1809, 1955). The rotary saturation effect manipulates the nuclear spin magnetization while it is rendered stationary, or "spin-locked" in the rotating frame of reference. In the spin-locking experiment, the equilibrium magnetization along the z-axis, coinciding with the static magnetic field $B_0$, is first tipped by a 90 degree RF pulse into the transverse x-y plane. Once in the transverse x-y plane, the magnetization is viewed as being stationary in the frame of reference with which it rotates (the rotating frame). In the laboratory frame, the conventional free induction decay (FID) is observed at this point. In the spin-lock experiment, however, a second resonant RF field ($B_{1\rho}$) is applied along the direction of the magnetization in the rotating frame. While this "spin-lock field", $B_{1\rho}$, is applied, the magnetization is seen to be stationary in the rotating frame since it is aligned along $B_{1\rho}$, which is also stationary in the rotating frame. Thus, the rotating frame picture is in "equilibrium" in analogy to the situation in the laboratory frame prior to excitation where the magnetization is aligned along $B_0$. The magnitude of the spin-locked magnetization can be observed by simply turning off $B_{1\rho}$ and measuring the amplitude of the resulting FID. Alternatively, the $B_{1\rho}$ field can be turned off, and the magnetization in the transverse plane flipped back up to the z-axis by a 90 degree pulse for subsequent sampling with a standard MR excitation. In the latter approach, the spin-lock period is called a "spin-lock preparation".

Since the spin-locked magnetization is created by $B_0$, it is much larger than the small $B_{1\rho}$ field would be able to create through true Boltzmann polarization. Thus, the spin-locked magnetization is in equilibrium in direction, but not in magnitude. As a result it will eventually relax to a much smaller value, but still be aligned along $B_{1\rho}$. This relaxation in the rotating frame has a characteristic time, $T_{1\rho}$. Typical values for $T_{1\rho}$ in vivo are hundreds of milliseconds, so the $B_{1\rho}$ state can last for several hundred milliseconds without substantial loss of magnetization. The mechanisms for $T_{1\rho}$ relaxation are analogous to normal $T_1$ relaxation: random magnetic fields fluctuating at the Larmor frequency and orthogonal to the equilibrium magnetization. While fluctuating fields in the plane transverse to the main magnetic field, $B_0$, cause $T_1$ relaxation in conventional $T_1$ experiments, fluctuating fields in the plane transverse to $B_{1\rho}$ cause $T_{1\rho}$ relaxation in the spin-lock experiment. Since the equivalent of the Larmor precession frequency in the spin-locked state is proportional to $B_{1\rho}$, the proper frequency for efficient saturation of the magnetization is orders of magnitude lower in frequency than that needed for normal $T_1$ relaxation.

In the spin-lock state, the spins experience longitudinal and transverse relaxation from external magnetic fields, characterized by the relaxation constants $T_{1\rho}$ and $T_{2\rho}$. These external magnetic fields are produced by bioelectromagnetic activity within the subject to be imaged. In one embodiment of the present invention, the magnetic fields that are responsible for the $T_{1\rho}$ and $T_{2\rho}$ relaxation are created by transient or oscillatory neuronal currents. External magnetic field fluctuations with a significant spectral density at the Larmor frequency in the rotating frame during spin-lock cause resonant longitudinal relaxation of the transverse magnetization in the spin-lock state, thereby shortening $T_{1\rho}$ relative to its normal (resting state) value and therefore reducing the spin-locked magnetization. The Larmor frequency in the rotating frame, $\omega_R$, is given by:

$$\omega_R = \gamma B_{1\rho},$$

where $\gamma$ is the gyromagnetic ratio of the nuclear spin species to be imaged, and $B_{1\rho}$ is the applied spin-lock RF field. Since $B_{1\rho}$ is substantially smaller than the main static magnetic field, $B_0$, $\omega_R$ is also substantially lower than the traditional Larmor frequency, $\omega=\gamma B_0$. Therefore the relatively slowly varying neuronal oscillations produce field fluctuations with a significant spectral density at this frequency. The amplitude of the applied field $B_{1\rho}$ is set to produce the resonant frequency ($\omega_R = \gamma B_{1\rho}$) at the expected frequency of the neuronal transient fields in order to sensitize the measurement to the neuronal fields.

To practice the present invention a subject or patient is placed in a conventional magnetic resonance imaging (MRI) system. In one embodiment, the MRI system is equipped with the ability to present sensory stimuli to the subject or otherwise allow the subject to engage in a cognitive task. Routine anatomical images may be acquired to facilitate identifying locations of bioelectromagnetic activity seen with the present method.

An MRI pulse sequence used to acquire image data includes a preparatory pulse sequence that places the nuclear spin magnetization used for MR imaging in the spin-lock state. This can be achieved either by traditional spin-lock, for example a 90 degree slice-selective or non-selective RF pulse which tips the magnetization from the equilibrium longitudinal axis into the transverse plane (e.g. along the x-axis) followed immediately by a resonant RF pulse with a phase chosen so that the RF $B_1$ field is along the same axis as the spins in the rotating frame ($B_{1\rho}$). An alternative is to use the spin-lock preparation pulse sequence to achieve the spin-locked state. (Borthakur et. al. "A pulse sequence for rapid in vivo spin-locked MRI." JMRI 2006; 23(4):591-6). In one embodiment on the present invention, the spins are held in the spin-locked state for some period of time, $T_{SL}$.

In one embodiment, transitory or oscillating magnetic fields from neuronal currents cause local or distributed magnetic fields in brain tissue. These magnetic fields are present during the spin-locking phase of the imaging pulse sequence. The frequency spectrum of these transitory or oscillating magnetic fields has a spectral power density at the resonant frequency in the rotating frame of the spin-lock ($\omega_R = \gamma B_{1\rho}$). The frequency of these fields can be manipulated by choice of stimulus such as, for example, auditory clicks or a tone modulated at a 40 Hz rate, which are know from MEG to produce a strong neuronal response with a 40 Hz frequency. Similarly, an alternating visual checkerboard pattern will produce oscillating neuronal dipoles in the visual cortex. If the frequency cannot be manipulated, for example as a result of spontaneous oscillatory behavior in normal or abnormal brain systems, then the amplitude of the spin-lock field ($B_{1\rho}$) can be adjusted or swept slowly to progressively higher or lower amplitudes in order to search for spontaneous oscillation frequencies.

In general, bioelectromagnetic fields cause $T_{1\rho}$ relaxation of the transverse magnetization during the spin lock period when the resonant condition is met. This in turn causes the measured MR signal to decrease in voxel locations where the bioelectromagnetic fields are present, which is additionally manifested by voxel darkening in reconstructed MR images. Alternatively, the $T_{1\rho}$ relaxation contrast phenomena can be described in terms of how the bioelectromagnetic fields interact with the spin-locked magnetization. In this alternative physical description the bioelectromagnetic fields act similar to a conventional radiofrequency pulse by tipping the spin-locked magnetization away from its equilibrium position. This results in T2* dephasing of the magnetization that is tipped, or rotated, away from the spin-locked magnetization that is aligned along $B_{1\rho}$. Both of these physical descriptions yield the same physical result, which we will herein refer to as $T_{1\rho}$ relaxation.

The spin-lock period is followed by an image encoding period where an MRI image is acquired using, for example, a single or multishot EPI or spiral readout trajectory. It should be apparent to one having ordinary skill in the art that any readout (single or multishot) can be used, and additionally with or without other methods such as parallel acquisition to accelerate imaging. The process is repeated to generate a time-series of images each of which have had the magnetization stored in the spin-lock state for some period of time ($T_{SL}$) within each image.

The image time-series is analyzed for statistically significant intensity changes which are correlated with the presence and/or timing of the stimulus. Alternatively, the images acquired with and without a stimulus can be compared to a resting state condition using a statistical test such as the Student's T-test.

In the case of spontaneously oscillating fields, the different $B_{1\rho}$ levels can be compared to each other to determine if relaxation is present at discrete frequencies. Alternatively, the frequency of the induced neuronal currents can be modulated by ramping the frequency of the driving stimulus. When the resonant condition is met, a statistically significant reduction in local signal amplitude is expected in activated regions of the brain. Regions in the brain with statistically significant signal changes indicative of neuronal activity may be overlaid on the anatomical MR images or the original spin-lock image data to identify the anatomical location of the neuronal currents.

DESCRIPTION OF THE PREFERRED EMBODIMENT

Referring particularly to FIG. 1, the preferred embodiment of the invention is employed in an MRI system. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22; and a data store server 23. In the preferred embodiment the data store server 23 is performed by the workstation processor 16 and associated disc drive interface circuitry. The server 18 is performed by a separate processor and the servers 20 and 22 are combined in a single processor. The workstation 10 and each processor for the servers 18, 20 and 22 are connected to an Ethernet communications network. This network conveys data that is downloaded to the servers 18, 20 and 22 from the workstation 10, and it conveys data that is communicated between the servers.

The pulse sequence server 18 functions in response to instructions downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients $G_x$, $G_y$ and $G_z$ used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by the RF coil 34 are received by the RF system 26, amplified, demodulated, filtered and digitized under direction of commands produced by the pulse sequence server 18. The RF system 26 includes an RF transmitter for producing a wide variety of RF pulses used in MR pulse sequences.

The RF transmitter is responsive to the scan prescription and direction from the pulse sequence server 18 to produce RF pulses of the desired frequency, phase and pulse amplitude waveform. The generated RF pulses may be applied to the whole body RF coil 34 or to one or more local coils or coil arrays.

The RF system 26 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined at any sampled point by the square root of the sum of the squares of the I and Q components:

$$M=\sqrt{I^2+Q^2},$$

and the phase of the received NMR signal may also be determined:

$$\varphi=\tan^{-1}Q/I.$$

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The pulse sequence server 18 also controls the operation of and devices used to stimulate the subject during the acquisition of MRI data.

The digitized NMR signal samples produced by the RF system 26 are received by the data acquisition server 20. The data acquisition server 20 operates in response to instructions downloaded from the workstation 10 to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with instructions downloaded from the workstation 10. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc.

Images reconstructed by the data processing server 22 are conveyed back to the workstation 10 where they are stored. Real-time images are stored in a data base memory cache (not shown) from which they may be output to operator display 12 or a display 42 which is located near the magnet assembly 30 for use by attending physicians. Batch mode images or selected real time images are stored in a host database on disc storage 44. When such images have been reconstructed and transferred to storage, the data processing server 22 notifies the data store server 23 on the workstation 10. The workstation 10 may be used by an operator to archive the images, produce films, or send the images via a network to other facilities.

Figure 2:
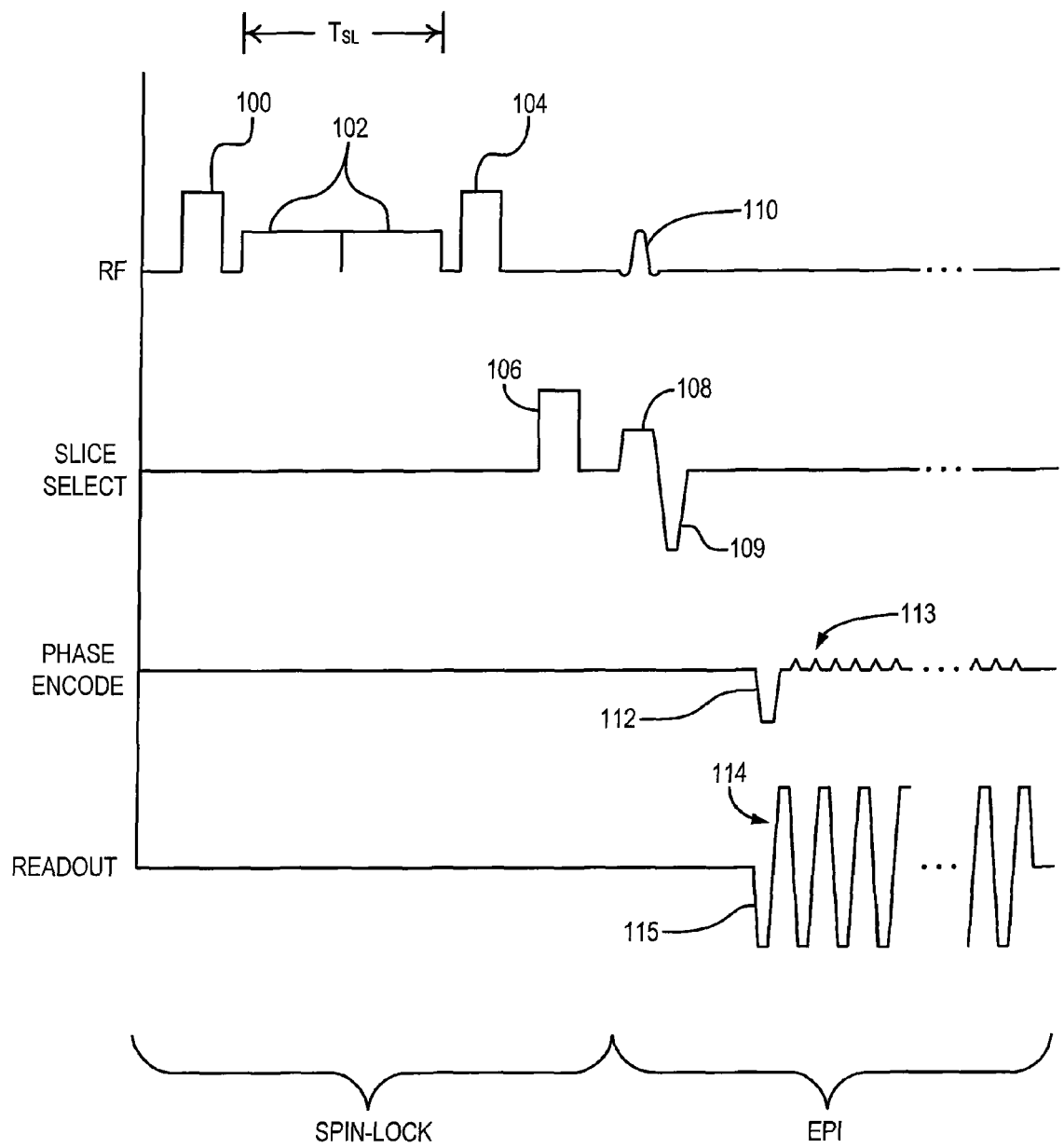
FIG. 2 is a graphic representation of a preferred pulse sequence performed by the MRI system of FIG. 1.

Referring particularly to FIG. 2, the preferred pulse sequence used to practice the present invention includes a spin-lock preparatory pulse sequence followed by an EPI imaging pulse sequence. The spin-lock sequence includes a nonselective 90 degree RF pulse 100 which excites spins that are then spin-locked in the transverse plane by the application of two phase-alternating spin-lock (SL) pulses 102, which are ±90 degree phase-shifted from the phase of the first 90 degree pulse 100. The phase-alternated SL RF pulses 102 reduce image artifacts that would otherwise result from $B_1$ field inhomogeneities. The duration of the SL pulses 102 is denoted as $T_{SL}$ and their amplitude determines the $B_{1\rho}$ field that is produced during the spin-lock condition. In the preferred embodiment of the invention the amplitude is set such that the Larmor frequency in the rotating frame ($\omega_R=\gamma B_{1\rho}$) is less than 100 Hz, which corresponds to the frequencies of magnetic field oscillations produced by post-synaptic currents. A second nonselective 90 degree RF pulse 104 restores the spin-locked magnetization to the longitudinal axis. High amplitude crusher gradient pulses 106 are applied to eliminate residual transverse magnetization. The "$T_{1\rho}$-prepared" longitudinal magnetization, $M(T_{SL})$, at the end of the crusher gradient 106 is described by the equation:

$$M(T_{SL})=M_0 e^{(-TSL/T_{1\rho})}$$

where $M_0$ is the thermal equilibrium magnetization, TSL is the duration of the spin-lock pulses 102, and $T_{1\rho}$ is the longitudinal relaxation in the rotating reference frame. This longitudinal magnetization has thus been modulated, or weighted, by changes in the $T_{1\rho}$ of the tissues being imaged.

For imaging the $T_1$-prepared signal, a gradient-echo echo planar imaging (EPI) readout is used in which an excitation pulse 110 is applied in the presence of a slice select gradient 108 to produce transverse magnetization in a slice through the subject. The excited spins are rephased by a negative lobe 109 on the slice select gradient and then a time interval elapses before the readout sequence begins. A train of acquired NMR gradient recalled echoes are produced by the application of an oscillating readout gradient field 114. The readout sequence is started with a negative readout gradient lobe 115 and the echo signals are produced as the readout gradient oscillates between positive and negative values. Spatial encoding of the echoes is accomplished by a series of phase encoding gradient pulses 112. The first pulse is a negative lobe 113 that occurs before the echo signals are acquired to encode the first view with a negative k-space location. Subsequent phase encoding pulses 112 occur as the readout gradient pulses 114 switch polarity, and they step the phase encoding monotonically upward through k-space.

In the preferred embodiment of the present invention the EPI imaging pulse sequence is separate from the spin-lock magnetization preparation pulse sequence, but many variations are possible. Other imaging pulse sequences can be employed after the spin-lock magnetization preparation pulse sequence, and the spin-lock magnetization preparation pulse sequence can be performed as an integral part of the imaging pulse sequence. In the latter case the second RF pulse 104 and the crusher gradient 106 are not required and a separate RF excitation pulse is not required in the image acquisition pulse sequence that follows. In this embodiment, the imaging pulse sequence reads out the NMR signal(s) produced by the transverse magnetization at the completion of the SL pulses 102.

Figure 3:
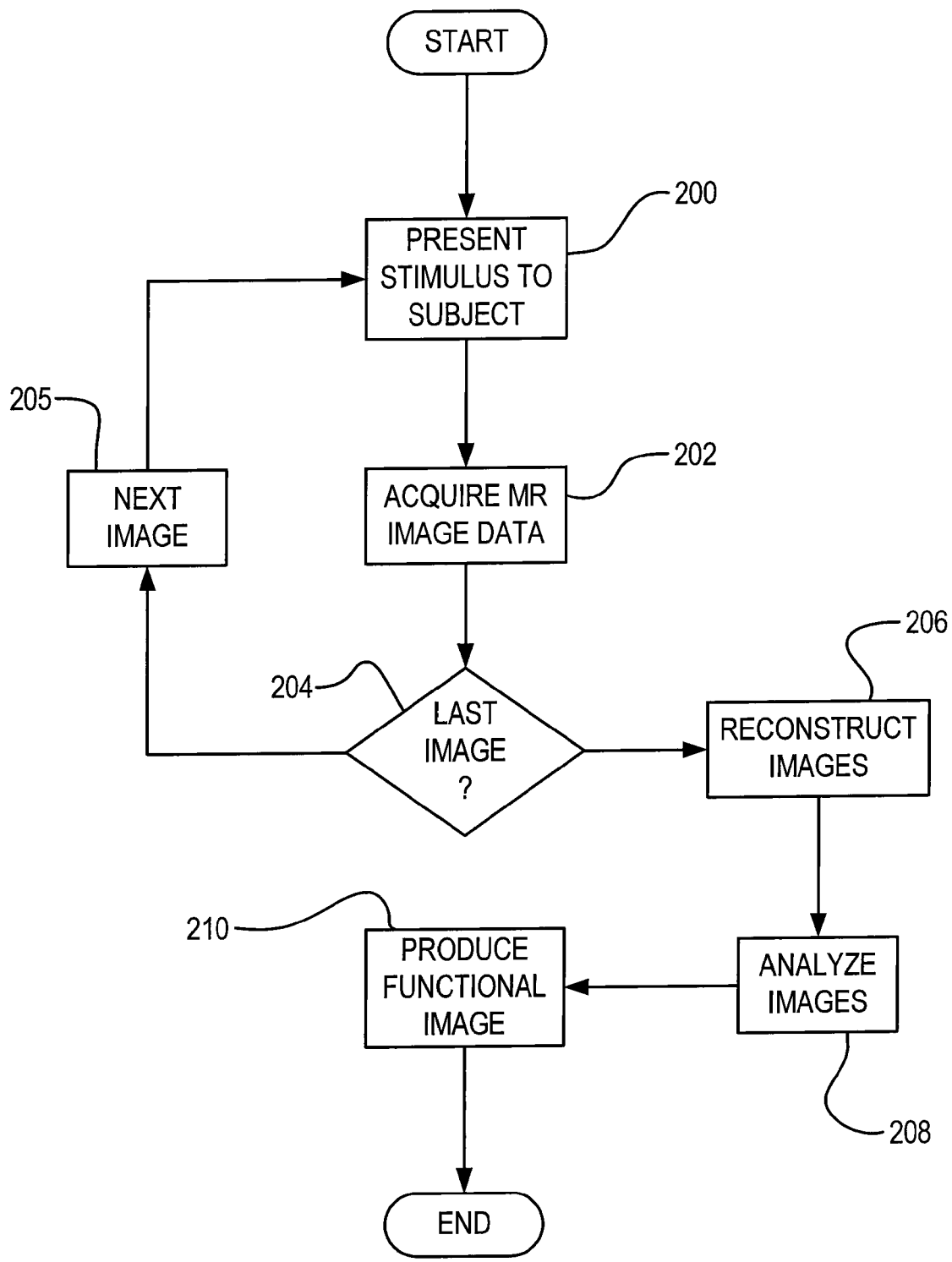
FIG. 3 is a flow chart of a preferred method for practicing the present invention.

Referring particularly to FIG. 3, a scan is performed by the MRI system of FIG. 1 on a subject placed in the bore of the magnet. A stimulation device (not shown) is also placed in position, and as indicated at process block 200, the selected subject stimulation is begun.

As indicated at process block 202, MR image data is then acquired using the pulse sequence of FIG. 2. The stimulation may be switched off after the spin-lock preparatory sequence is completed. A time-series of images are acquired during a scan and a test is made at decision block 204 to determine if the last image has been acquired. If all of the image data has not yet been acquired, the next image in the time-series is acquired at process block 205.

After the data acquisition phase of the scan is completed the acquired image data is processed as indicated at process block 206 to reconstruct a series of $T_{1\rho}$ weighted images. These are analyzed at process block 208 to detect neuronally active locations in the subject and images are produced as indicated at process block 210 in which these active locations are parametrically displayed over registered anatomic images. The analysis may be done in many different ways, but the objective is to identify locations where the $T_{1\rho}$-weighted image signal is reduced during the subject stimulation or when the subject performs a task. In general the processing methods now used in fMRI BOLD studies may be used to perform this step.

Spin-locking can be utilized to create image contrast in response to magnetic field fluctuations in the frequency range of neuronal magnetic field oscillations. Even at reasonably low current dipole strengths the magnitude change is readily visible after about 100 averages without need for statistical detection. This approach is capable of detecting oscillatory magnetic fields originating from neuronal currents. Furthermore the high frequency specificity allows the design of detection experiments focusing on narrow band oscillations that can be evoked or induced by particular stimuli, making this an approach for the localization of oscillatory activity in the brain.

It can be appreciated by those skilled in the art that many variations can be made from the preferred embodiment without departing from the spirit of the invention. For example, $T_{1\rho}$ contrast agents may be administered to the subject prior to image acquisition to enhance the $T_{1\rho}$-weighted image that is acquired. Also, in the preferred embodiment the rotating frame Larmor frequency is set for low frequency oscillations, however, other frequency ranges are also useful. For example, in spinal cord, white matter and brainstem nuclei magnetic field oscillations are produced at higher frequencies in the range of 800 to 1200 Hz. In summary, by setting the spin-lock RF magnetic field $B_{1\rho}$ to a selected amplitude, the $T_{1\rho}$-weighted contrast can be made sensitive to magnetic field variations in the subject being imaged at any desired frequency.

The invention claimed is:

1. A method for producing an image of bioelectromagnetic activity in a subject with a magnetic resonance imaging (MRI) system, the steps comprising:
   a) acquiring $T_{1\rho}$-weighted image data from the subject using a pulse sequence that directs the MRI system to perform a spin-lock preparatory pulse sequence prior to acquiring nuclear magnetic resonance (NMR) image data, wherein the spin-lock preparatory pulse sequence includes applying a spin-lock radio frequency (RF) field, $B_{1\rho}$, that establishes a spin-lock condition in transverse spin magnetization such that transverse spin magnetization in the spin-lock condition is rotated by bioelectromagnetic fields directly produced by neuronal activity in the subject;
   b) reconstructing an image with the acquired $T_{1\rho}$-weighted image data; and
   c) analyzing image signals in the $T_{1\rho}$-weighted image to detect locations of neuronal activity in the subject.

2. The method as recited in claim 1 in which a magnitude of the spin-lock RF field, $B_{1\rho}$, is set to establish a Larmor frequency in a rotating frame of transverse magnetization that is substantially similar to a frequency of magnetic field fluctuations produced by the bioelectromagnetic field produced by neuronal activity in the subject.

3. The method as recited in claim 2 in which the Larmor frequency in the rotating frame is less than 100 Hz.

4. The method as recited in claim 1 in which the spin-lock preparatory pulse sequence includes:
   a first RF excitation pulse that tips longitudinal spin magnetization to a transverse plane prior to establishing the spin-lock condition with the spin-lock RF field, $B_{1\rho}$; and
   a second RF excitation pulse that tips the transverse spin magnetization back to longitudinal spin magnetization after the established spin-lock condition.

5. The method as recited in claim 4 in which an imaging pulse sequence is performed by the MRI system after the second RF excitation pulse.

6. The method as recited in claim 5 in which the imaging pulse sequence is an echo planar imaging (EPI) pulse sequence.

7. The method as recited in claim 5 in which the spin-lock preparatory pulse sequence also includes a gradient pulse that dephases transverse magnetization that remains after application of the second RF excitation pulse.

8. The method as recited in claim 1 in which the spin-lock RF field, $B_{1\rho}$, is applied for a time period sufficiently long to enable the bioelectromagnetic fields produced by neuronal activity to alter the transverse spin magnetization in the spin-lock condition, the altered transverse spin magnetization providing a contrast mechanism for detecting the neuronal activity.

9. The method as recited in claim 1 in which the spin-lock preparatory pulse sequence includes:
   a first RF excitation pulse that produces transverse spin magnetization by tipping longitudinal spin magnetization to a transverse plane prior to establishing the spin-lock condition with the spin-lock RF field, $B_{1\rho}$; and
   an imaging pulse sequence that reads out an NMR signal produced by the transverse spin magnetization after the established spin-lock condition.

10. The method as recited in claim 9 in which the spin-lock RF field, $B_{1\rho}$, is applied for a time period sufficiently long to enable the bioelectromagnetic fields produced by neuronal activity to alter the transverse spin magnetization in the spin-lock condition, the altered transverse spin magnetization providing a contrast mechanism for detecting the neuronal activity.

11. The method as recited in claim 1 in which step c) includes analyzing the image signals in the $T_{1\rho}$-weighted image to identify locations where the $T_{1\rho}$-weighted image signal is reduced in order to detect locations of neuronal activity in the subject.

* * * * *